United States Patent [19]
Behagel et al.

[11] Patent Number: 5,182,479
[45] Date of Patent: Jan. 26, 1993

[54] GATE CIRCUIT HAVING INCREASED VOLTAGE HANDLING CAPABILITY

[75] Inventors: Frank P. Behagel, Eindhoven; Tiemen Poorter, Heerlen; Petrus A. C. M. Nuijten, Eindhoven, all of Netherlands

[73] Assignee: U.S. Philips Corp., New York, N.Y.

[21] Appl. No.: 658,792

[22] Filed: Feb. 7, 1991

Related U.S. Application Data

[63] Continuation of Ser. No. 319,772, Mar. 7, 1989, abandoned.

[30] Foreign Application Priority Data

Jun. 24, 1988 [NL]  Netherlands ......................... 8801611

[51] Int. Cl.$^5$ .................... H03K 17/687; H03K 5/13; H03K 19/094; H03K 3/26
[52] U.S. Cl. .................................. 307/571; 307/576; 307/594; 307/597; 307/603; 307/605; 307/451; 307/279
[58] Field of Search ................ 307/576, 579, 571, 585, 307/594, 451, 270, 279, 530, 597, 603, 605

[56] References Cited

U.S. PATENT DOCUMENTS

| | | | |
|---|---|---|---|
| 4,001,606 | 1/1977 | Dingwall | 307/576 |
| 4,518,873 | 5/1985 | Suzuki et al. | 307/576 |
| 4,695,744 | 9/1987 | Giordano | 307/279 |
| 4,707,620 | 11/1987 | Sullivan et al. | 307/270 |
| 4,797,579 | 1/1989 | Lewis | 307/475 |
| 4,801,819 | 1/1989 | Theus et al. | 307/279 |
| 4,829,199 | 5/1989 | Prater | 307/451 |
| 4,874,971 | 10/1989 | Fletcher | 307/576 |

FOREIGN PATENT DOCUMENTS 0244119 12/1985 Japan ................................. 307/576

OTHER PUBLICATIONS

"Device Parameter Independent Delay Circuit", IBM Technical Disclosure Bulletin, vol. 31, No. 1, Jun. 1988, pp. 21-23.

*Primary Examiner*—Stanley D. Miller
*Assistant Examiner*—Trong Phan
*Attorney, Agent, or Firm*—Steven R. Biren

[57] ABSTRACT

A gate circuit includes an N-channel and a P-channel insulated gate field-effect transistor whose parallel-connected drain-source paths constitute an analog signal gate and a control circuit, connected to the respective gate electrodes, to turn on and/or turn off the two field-effect transistors. In order to handle signals whose voltage value is higher than the maximum permissible drain-source voltage in the on-state of the N-channel field-effect transistor, means are provided, for turning on the N-channel field-effect transistor at least at a drain-source voltage below a predetermined value. In an embodiment of the invention the means include delay means coupled to the control circuit for turning on the N-channel field-effect transistor with a delay relative to the P-channel field-effect transistor. In another embodiment of the invention the means include switching means arranged in series with the analog signal gate, for temporarily connecting the signal gate to at least one auxiliary voltage.

5 Claims, 3 Drawing Sheets

GATE CIRCUIT HAVING INCREASED VOLTAGE HANDLING CAPABILITY

This is a continuation of application Ser. No. 319,772, filed Mar. 7, 1989, now abandoned.

BACKGROUND OF THE INVENTION

The invention relates to a gate circuit including an N-channel and a P-channel insulated-gate field-effect transistor, whose parallel-connected drain-source paths constitute an analog signal gate, and a control circuit connected to the respective gate electrodes to turn on and/or turn off the two field-effect transistors. Gate circuits of this type are known per se and are employed, for example, as analog semiconductor switches in multiplexers.

As a result of the reduction of the effective channel length of present insulated-gate field-effect transistors, generally referred to as MOS (Metal Oxide Silicon) transistors, and the trend towards standard power-supply voltages, the electric field strength in MOS transistors has increased. When the strength of the electric field near the drain region of a MOS transistor has a value larger than 2 to $3.10^5$ V/cm this region will contain many high-energy electrons and holes. As a result of their high velocity these charge carriers collide with the atoms of the semiconductor material, so that charge carriers are scattered in all directions. These scattered charge carriers partly reach the gate oxide, in which they may be slowed down to such an extent that they remain therein as fixed charges.

Said fixed charges inter alia give rise to a change in threshold voltage of the MOS transistor. Depending on the amount of fixed charge there may be a considerable shift in threshold voltage, as a result of which the characteristics of the MOS transistor will be too far out of specification and its reliability will be reduced. In practice, a change in threshold voltage of a MOS transistor by more than 100 mV is generally not acceptable.

In BIMOS technology, in which both bipolar components and field-effect transistors are formed in the semiconductor substrate, the maximum permissible drain-source voltage in the conductive state is considered to be approximately 5.5 V for an N-channel MOS transistor and approximately 8.5 V for a P-channel MOS transistor, in order to ensure that the threshold voltage will not vary by more than 100 mV during the life of the relevant field-effect transistors. The higher permissible drain-source voltage for a P-channel MOS transistor is caused by the fact that in a P-channel MOS transistor the free charge carriers are mainly holes, which have a lower mobility than electrons, i.e. the holes experience a lower acceleration at the same field strength. In the nonconductive state the maximum permissible drain-source voltages are substantially higher and are mainly considered by breakdown of the parasitic diodes and the gate oxide of the transistors.

In English technical literature the above effect is referred to as the "hot-carrier effect". As a result of this, a gate circuit constructed by means of field-effect transistors in BIMOS technology can handle only signals having an r.m.s. value smaller than approximately 1.75 V if no additional steps are taken. Larger signals have to be attenuated before they can be applied to the signal gate. However, this results in an undesired deterioration of the signal-to-noise ratio, because the signal strength is reduced and the noise increases as a result of the noise contributed by the attenuator.

SUMMARY OF THE INVENTION

The invention primarily aims at providing a gate circuit of the type defined above, which is capable of handling signals whose voltage is at least higher than the maximum permissible drain-source voltage in the conductive state of the N-channel MOS transistor which is employed.

According to the invention, this is achieved in that means are provided for turning on the N-channel field-effect transistor at least at a drain-source voltage lower than a predetermined value.

As described in the foregoing, the maximum permissible drain-source voltage in the on-state of the N-channel MOS transistor dictates whether the gate circuit will ultimately be driven into full conduction. The purpose of said means is to drive the N-channel field-effect transistor of the gate circuit into conduction only when its drain-source voltage is smaller than or equal to the maximum permissible value in the conductive state. During conduction the drain-source voltage can be kept sufficiently low in a known manner by arranging a suitable load resistance in series with the gate circuit.

An embodiment of the gate circuit, in accordance with the invention, which advantageously utilizes the difference in maximum permissible drain-source voltage between an N-channel and a P-channel MOS transistor in the on-state, is characterized in that said means comprise delay means coupled to the control circuit, for turning on the N-channel field-effect transistor with a delay relative to the P-channel field-effect transistor. Said delay means can be constructed in a variety of manners known in practice.

If it is assumed that the strength of the signals to be handled is smaller than the maximum permissible drain-source voltage in the on state of the P-channel MOS transistor, this transistor can be driven into conduction directly by means of the control circuit without any additional means. Depending on the load, dimensioning and the signal strength applied to the gate circuit, the drain-source voltage will decrease, after some time, below the maximum permissible value in the on state of the N-channel MOS transistor, after which the N-channel MOS transistor can be turned on without any problem.

In this way the gate circuit is capable of handling signals larger than the maximum permissible drain-source voltage of the N-channel MOS transistor. P-channel MOS transistors in BIMOS technology can handle signals having an r.m.s. value of approximately 2.75 V.

In practice the delay time is adapted to the worst-case conditions which can occur in the relevant circuit, such as the maximum signal strength to be handled and the maximum (capacitive) load of the gate circuit. For turning off the gate circuit it is not necessary to allow for the hot carrier effect, because at the turn-off instant the drain-source voltage across the two MOS transistors is still so low that it will be below the maximum permissible drain-source voltage of the N-channel MOS transistor in the on-state.

An embodiment of the invention which is very suitable for the use of BIMOS technology and which enables the gate circuit to be driven with a drive voltage lower than the maximum signal voltage to be handled, is characterized in that the control circuit comprises a first and a second series arrangement of an N-channel and a P-channel field-effect transistor, which series arrangements are each coupled to a first and a second power-supply terminal, the field-effect transistors of one conductivity type being cross-coupled to each other to form a bistable trigger circuit, the gate electrode of the field-effect transistor of the other conductivity type of the first series arrangement, via an inverter circuit, and the gate electrode of the corresponding field-effect transistor of the second series arrangement being coupled to a control input terminal for controlling the N-channel and P-channel field-effect transistors of the signal gate, whose gate electrodes are coupled to the first and the second series arrangement respectively, and the control circuit further comprising one or more further field-effect transistors which are arranged in cascode with the field-effect transistors of the first and the second series arrangement and whose gate electrodes constitute one or more terminals for applying one or more auxiliary voltages.

The bistable trigger circuit is capable of providing a delay time which is adequate for the N-channel MOS transistor of the analog signal gate to be turned on with a delay relative to the P-channel MOS transistor.

The voltage to be applied to the first and the second power-supply terminal is dictated by the maximum signal voltage to be handled. By cascoding the MOS transistors of the first and the second series arrangement it is achieved that for each MOS transistor the drain-source voltage in the on-state is lower than the maximum permissible value, thereby also precluding degradation of the MOS transistors in the control circuit thus formed.

The turn-on delay of the N-channel MOS transistor of the signal gate can be adjusted by a suitable choice of the dimensions of the MOS transistors of the control circuit. Yet another embodiment of the invention is characterized in that the width/length ratio of the drain-source channel of the field-effect transistors of the first and the second series arrangement is smaller for one conductivity type than for the other conductivity type.

Since the MOS transistors of the other conductivity type, which have larger dimensions, inter alia represent higher parasitic capacitances than the transistors of the one conductivity type which are coupled thereto and which have the smaller channel dimensions, the voltage levels of the two series arrangements will vary relative to one another with a mutual delay as a result of charging and discharging of said parasitic capacitances. Consequently, the gate voltages of the N-channel and P-channel MOS transistors of the signal gate applied said arrangement will be switched with a delay relative to one another, as required.

Moreover, the N-channel MOS transistor of the signal gate can also be turned on with a delay relative to the P-channel MOS transistor if the width/length ratio of the drain-source channel of the field-effect transistor of the one conductivity type of the first series arrangement is smaller than that of the corresponding field-effect transistor of the second series arrangement.

Yet a further embodiment, for reducing the drain-source voltage when the parallel-connected MOS transistors of the gate circuit are driven into conduction, is characterized in that said means comprise switching means arranged in series with the analog signal gate, for connecting the signal gate to at least one auxiliary voltage.

In this embodiment, prior to the N-channel and P-channel MOS transistors of the gate circuit being turned on, an auxiliary voltage is applied to one side of the gate circuit for some time via additional switching means, such that the maximum voltage difference between this auxiliary voltage and the signal source connected to the other side of the gate circuit is smaller than or equal to the maximum permissible drain-source voltage in the on state of the N-channel MOS transistor. When the control circuit is provided with the delay means described above the maximum voltage difference can be smaller than or equal to the higher maximum drain-source voltage in the conductive state of the P-channel MOS transistor.

The temporary connection to an auxiliary source can also be advantageous if a plurality of signal sources is connected to a common bus by means of gate circuits, only one gate circuit being turned on at a time, as for example in an analog multiplexer. This will give rise to problems when another source is to be selected which has such a voltage that the instantaneous voltage difference relative to the common bus is larger than the maximum permissible drain-source voltage of the MOS-transistors in the on-state. If the bus is connected to the auxiliary voltage source for some time after cut-off of the gate circuit previously coupled thereto, the bus can be brought to such a voltage that the maximum drain-source voltage in the on-state of the MOS transistors of the gate circuit to be turned on is not exceeded.

By means of only one auxiliary voltage of a value equal to half the maximum signal source voltage a customary gate circuit can handle signals having a maximum voltage value of twice the maximum permissible drain-source voltage in the on-state of the N-channel MOS transistor.

The additional switching means themselves can also be constructed by means of gate circuits comprising parallel connected N-channel and P-channel MOS transistors. If, without the use of the delay means described in the foregoing, even higher signal voltages than twice the maximum permissible drain-source voltage in the on-state of the N-channel MOS transistors have to be handled, additional switching means with a plurality of auxiliary voltages and a further control circuit may be employed in a similar way in order to bring the bus in steps at the desired voltage.

BRIEF DESCRIPTION OF THE DRAWING

Several embodiments of the invention will now be described in more detail, by way of example, with reference to the accompanying drawings, in which.

DESCRIPTION OF THE PREFERRED EMBODIMENTS

Figure 1:
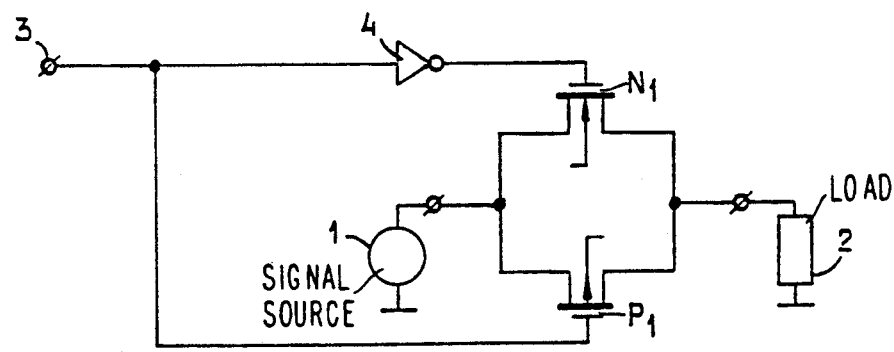
FIG. 1 is the basic diagram of a known analog gate circuit comprising a parallel-connected P-channel and N-channel MOS transistor and a control circuit.

FIG. 1 shows diagrammatically an N-channel MOS transistor N1 and a P-channel MOS transistor $P_1$ having parallel-connected drain-source paths. A signal source 1 is connected to one side and a load 2 is connected to the other side of the analog signal gate thus formed. The transistor $P_1$ has its gate electrode connected to a terminal 3 for applying a control signal. To apply a complementary control signal the gate of the transistor $N_1$ is connected to the terminal 3 via an inverter circuit 4. Depending on the magnitude of the control voltage on the terminal 3 the gate circuit is in the on state or in the off state.

Under normal conditions the inverter circuit causes such a small delay in the transfer of the control voltage from the terminal 3 to the gate electrode of the transistor $N_1$ that the two MOS transistors are driven almost simultaneously. In practice, the maximum permissible signal source voltage for this circuit is therefore equal to the maximum permissible drain-source voltage in the on-state of the N-channel MOS transistor.

Figure 2:
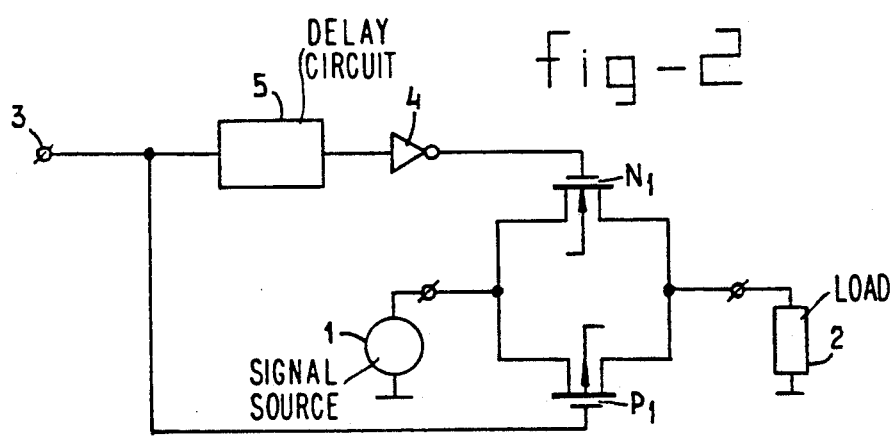
FIG. 2 is the basic diagram of an embodiment of the gate circuit in accordance with the invention.

FIG. 2 shows the basic diagram of an embodiment of the invention, which in comparison with the circuit shown in FIG. 1 comprises an additional delay circuit 5 arranged in the connection between the terminal 3 and the gate electrode of the transistor $N_1$ for the delayed transfer the control signal on the terminal 3 to the gate electrode of the transistor $N_1$. The delay time of the delay circuit is selected in such a way that the transistor $N_1$ is turned on only when, as a result of the transistor $P_1$ being turned on, the drain-source voltage is lower than the maximum permissible drain-source voltage in the on-state of the N-channel MOS transistor $N_1$. The delay circuit 5 can be constructed in various known manners.

In order to minimize the likelihood of degradation of the MOS transistors as a result of the hot-carrier effect the delay time should, in practice, be adapted to the worst-case operating conditions, i.e. the maximum source signal and the maximum (capacitive) load.

For MOS transistors in BIMOS technology the maximum source voltage can be 8 V. Consequently the circuit shown in FIG. 2 is for directly, i.e. without the use of attenuator means handling for example, sinusoidal alternating voltages with an r.m.s. value of maximum 2.75 V, which is advantageous because there are many practical uses where voltages having an r.m.s. value of 2.5 V must be handled.

Figure 3:
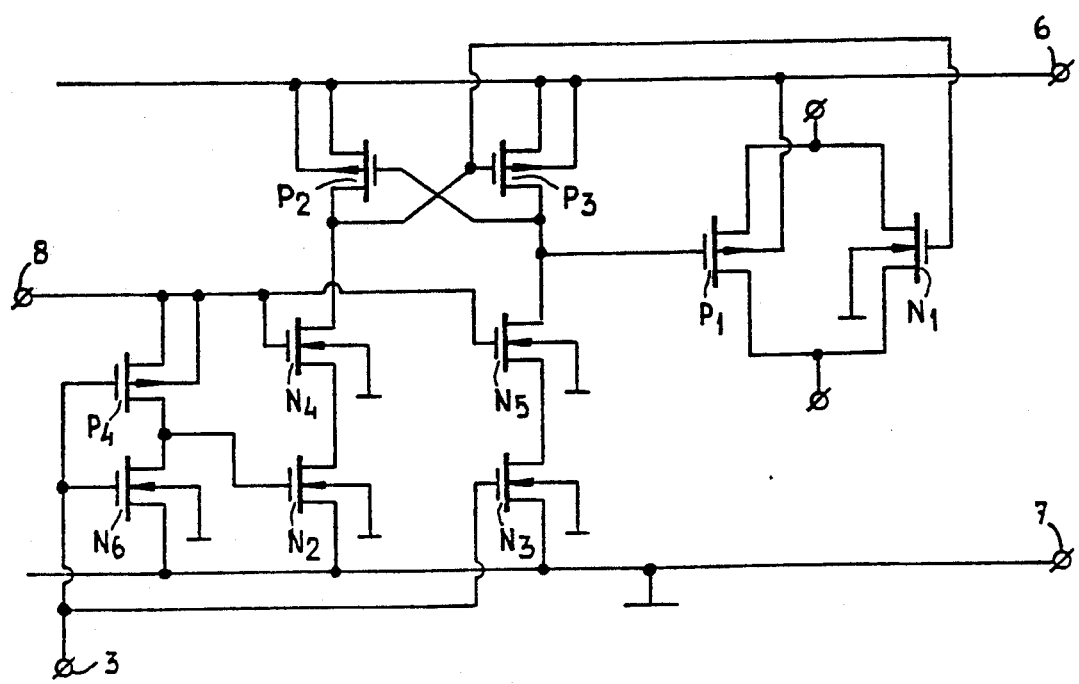
FIG. 3 is a circuit diagram of a practical embodiment of the circuit shown in FIG. 2.

FIG. 3 shows the circuit diagram of a practical embodiment of the circuit of FIG. 2, in which the delay circuit 5 and the inverter circuit 4 are integrated to form one unit.

The circuit comprises a first and a second series arrangement of a P-channel MOS transistor $P_2$, $P_3$ arranged in cascode with two N-channel MOS transistors $N_2$, $N_4$ and $N_3$, $N_5$ respectively. The source electrodes of the transistors $P_2$, $P_3$ are connected to a first power-supply terminal 6, for applying a positive power-supply voltage relative to signal ground, and the source electrodes of the transistors $N_2$, $N_3$ are connected to a second power-supply terminal 7 which is also connected to signal ground. A maximum voltage of 8 V may be applied between the first power-supply terminal 6 and the second power-supply terminal 7. The drain and gate electrodes of the transistors $P_2$ and $P_3$ are cross-coupled to one another and constitute a bistable trigger circuit. The gate electrodes of the cascode transistors $N_4$ and $N_5$ are connected to a third power-supply terminal 8, for applying a voltage of 5 V relative to the second power-supply terminal 7.

The control circuit further comprises an inverter circuit, known per se, comprising a series arrangement of a P-channel MOS transistor $P_4$ and an N-channel MOS transistor $N_6$. The source electrode of the transistor $P_4$ is connected to the third power-supply terminal 8 and the source electrode of the transistor $N_6$ is connected to the second power-supply terminal 7. The gate electrode of the transistor $N_2$ of the first series arrangement is connected to the junction point between the inverter transistors $P_4$ and $N_6$. The gate electrodes of the transistors $P_4$, $N_6$ and $N_3$ are connected to the control-signal terminal 3.

Again the analog signal gate comprises the transistors $P_1$ and $N_1$, the gate electrode of the transistor $P_1$ being connected to the drain electrode of the transistor $P_3$ and the gate electrode of the transistor $N_1$ being connected to the drain electrode of the transistor $P_2$. Further, the substrate of the P-channel MOS transistors is connected to the associated power-supply terminal and the substrate of the N-channel MOS transistors is connected to the signal ground 7.

In fact the control circuit comprises a voltage-level converter, for operating the gate circuit, which is connected to the power-supply terminal 6 at, for example, 8 V and to the power-supply terminal 8 at 5 V, with a customary logic signal of, for example, 5 V, and a bistable trigger circuit for providing the turn-on delay of the N-channel MOS transistor $N_1$. The circuit operates as follows.

When it is assumed that all the MOS transistors are of the enhancement type the transistors $P_4$, $N_2$, $N_4$ and $P_3$ will be turned on and the transistors $N_6$, $N_3$, $N_5$ and $P_2$ will be cut off when the control voltage on the terminal 3 is smaller than the threshold voltage for which the N-channel MOS transistors are turned on, which control voltage corresponds to a logic "0"-signal. The gate circuit is now turned off.

If the control voltage on the terminal 3 goes to 5 V, corresponding to a logic "1" signal, the transistors $N_6$, $N_3$ and $N_5$ will be turned on, causing the voltage on the gate electrode of the transistor $P_1$ to decrease (discharging of parasitic capacitances) and to become smaller than the voltage on its source electrode minus its threshold voltage, so that the transistor $P_1$ is turned on. When, moreover, the transistors $N_2$ and $N_4$ are cut off the transistor $P_2$ will be turned on (depending on the magnitude of the parasitic capacitances of the relevant branch) and $P_3$ will be turned off. The voltage on the gate electrode of the transistor $N_1$ of the gate circuit will now be higher than its source voltage plus its threshold voltage, so that $N_1$ is also driven into conduction.

In order to preclude degeneration of the N-channel MOS transistor $N_1$ as a result of the hot-carrier effect, the turn-on delay should be such that turning on of the transistor $P_1$ causes the drain-source voltage to decrease below the maximum permissible drain-source voltage in the on-state of the MOS transistor $N_1$.

As already stated above the turn-on delay of the transistor $N_1$ can be increased by making the width-/length ratio of the drain-source channel of the N-transistors in the control circuit larger than the width/length ratio of the drain-source channel of the P-channel MOS transistors $P_2$ and $P_3$. In practice, favorable results are obtained with configurations in which the width/length ratio of the drain-source channel of the N-channel MOS transistors is four times as large as the width/length ratio of the drain-source channel of the transistors $P_2$ and $P_3$.

The delay can be further increased by making the width/length ratio of the drain-source channel of the transistor $P_2$ smaller than that of the transistor $P_3$, so that the transistor $N_1$ of the gate circuit is turned on even later than the transistor $P_1$ of this circuit. In the circuit shown in FIG. 3 this means that the gate circuit can take a higher capacitive load.

Both for a high and a low control voltage on the terminal 3 the control circuit is fully currentless, so that no degradation of the N-channel MOS transistors will occur. The transistors $N_2$ and $N_3$ can be turned on only during switching when their respective drain-source voltage is larger than the maximum permissible drain-source voltage in the on-state. In the circuit shown in FIG. 3 this problem is solved by arranging a further N-channel MOS transistor $N_4$ or $N_5$ in cascode with the transistor $N_2$ or $N_3$ respectively.

By making the width/length ratio of the drain-source channel of the cascode transistors $N_4$, $N_5$ sufficiently large, for example twice as large as that of the transistors $N_2$ and $N_3$, it is ensured that the drain-source voltage across the respective N-channel MOS transistors cannot become larger than the maximum permissible drain-source voltage in the on-state.

If, moreover, signals having voltage value higher than the maximum permissible drain-source voltage in the on-state of the P-channel MOS transistor of the signal gate have to be handled, it may be necessary to arrange several cascode transistors in the control circuit, both for the N-channel and for the P-channel transistors.

Figure 4:
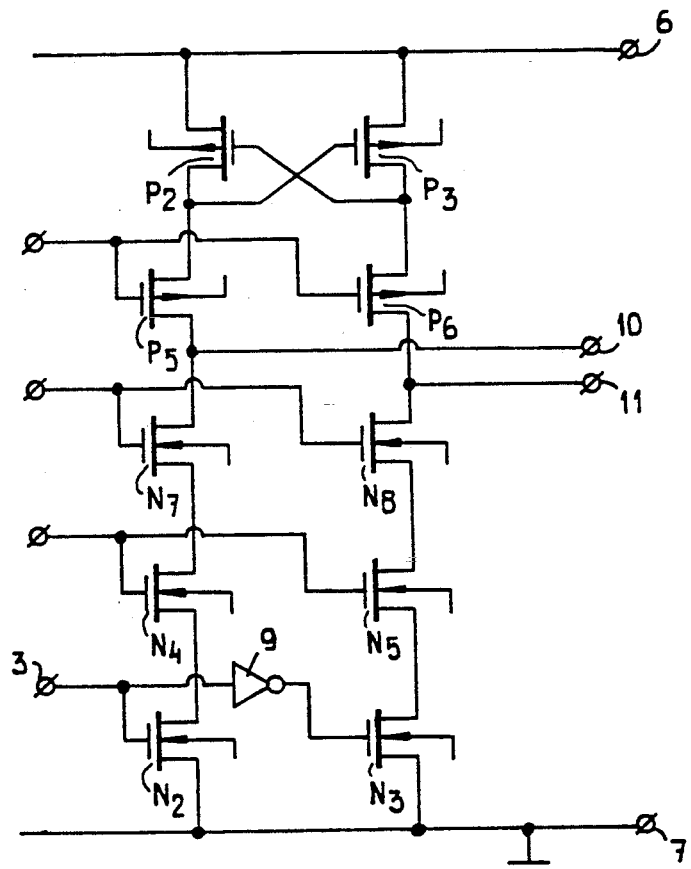
FIG. 4 shows a control circuit similar to that shown in FIG. 3, comprising a plurality of MOS transistors arranged in cascode.

FIG. 4 shows an example of such a circuit, in which the inverter circuit comprising the transistors $P_4$ and $N_6$ (FIG. 3) is represented symbolically by the inverter 9. The gate circuit, not shown, should be connected to the terminals 10, 11. A voltage equal to the sum of the maximum permissible drain-source voltage in the on-state of the N-channel MOS transistors and the threshold voltage of the MOS transistors should be applied to the interconnected gate electrodes of the transistors $N_4$ and $N_5$. A voltage equal to the sum of twice the maximum permissible drain-source voltage plus and the threshold value should be applied to the interconnected gate electrodes of the transistor $N_7$ and $N_8$, and a voltage equal to the supply voltage minus the absolute value of the threshold voltage and the maximum drain-source voltage in the on-state of a P-channel MOS transistor should be applied to the interconnected gate electrodes of the transistors $P_5$ and $P_6$. The use of a plurality of cascode arrangements with additional auxiliary sources enables even higher voltages to be handled.

The signal-gate control circuits shown in FIGS. 3 and 4 can be modified simply, inter alia by cross-coupling the respective drain and gate electrodes of the transistors $N_2$ and $N_3$ instead of those of the transistors $P_2$ and $P_3$, the control signal for controlling the gate circuit being applied to the gate of the transistor $P_3$ and, via an inverter to the gate of the transistor $P_2$. Again one or more cascode transistors should be included depending on the power-supply voltage. It is obvious that apart from a direct coupling of the control circuit to the gate electrodes of the transistors of the gate circuit this circuit can also be controlled via one or more intermediate driver stages.

Figure 5A:
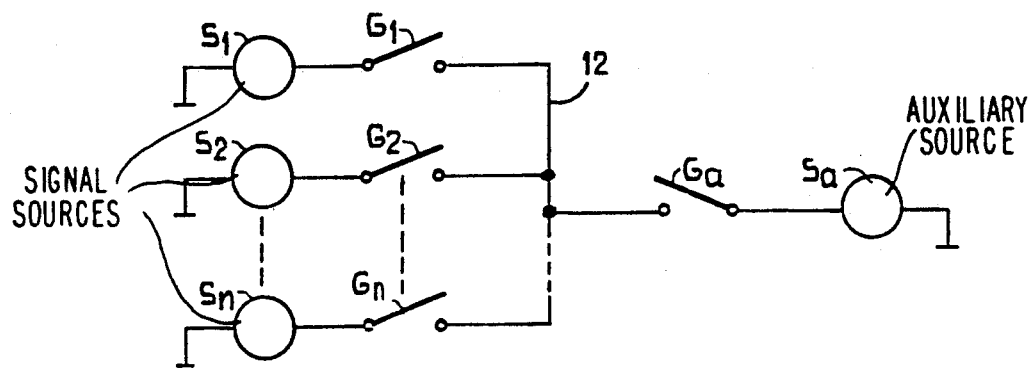
FIG. 5a is the basic diagram of a further embodiment of the invention, comprising additional switching means for applying an auxiliary voltage.

FIG. 5a shows the basic diagram of a further embodiment for turning on an analog signal gate at a drain-source voltage lower than the maximum permissible drain-source voltage in the on-state of the N-channel field-effect transistor.

FIG. 5a essentially shows a system in which a plurality of signal source $S_1$, $S_2$, ... $S_n$ are connected to a bus 12 via analog signal gates $G_1$, $G_2$, ... $G_n$ respectively, only one of the gates being conductive (sources selector). For simplicity, the analog gate circuits $G_1$, $G_2$, ... $G_n$ are represented as switches (n being an integer larger than zero).

In the case of such a source selector problems arise when another source has to be selected. Just before the instantaneously conducting gate circuit, for example $G_1$, is turned off the bus 12 is at the instantaneous voltage of the source $S_1$, for example 8 V. When the gate circuit $G_1$ is turned off and the gate circuit $G_2$ is turned on the drain-source voltage across $G_2$ is equal to the instantaneous voltage difference between the bus 12 and the source $S_2$. Since the source voltages are not known initially the drain-source voltage across $G_2$, in the case that the source $S_2$ has a voltage of 0 V, will be larger than the maximum permissible drain-source voltage in the on-state of an N-channel MOS transistor in BIMOS technology. Since in the present example the maximum drain-source voltage is 8 V, the gate circuits $G_1$, $G_2$, ... $G_n$ can be constructed advantageously in a way as shown in FIGS. 2 to 4.

Another possibility in accordance with the invention is the use of an additional auxiliary source $S_a$, which is connected to the bus 12 via an additional gate circuit $G_a$ constructed as shown in FIGS. 2 to 4. In the present example this auxiliary source has for example a direct voltage of 4 V. If during the change over from one signal source to another this auxilliary voltage is applied temporarily, to bring the bus 12 at a voltage of 4 V, the drain-source voltage across the gate circuits $G_1$, $G_2$, ... $G_n$ and the additional gate circuit $G_a$ will always be limited to 4 V. This will be explained with reference to FIG. 5b.

Figure 5B:
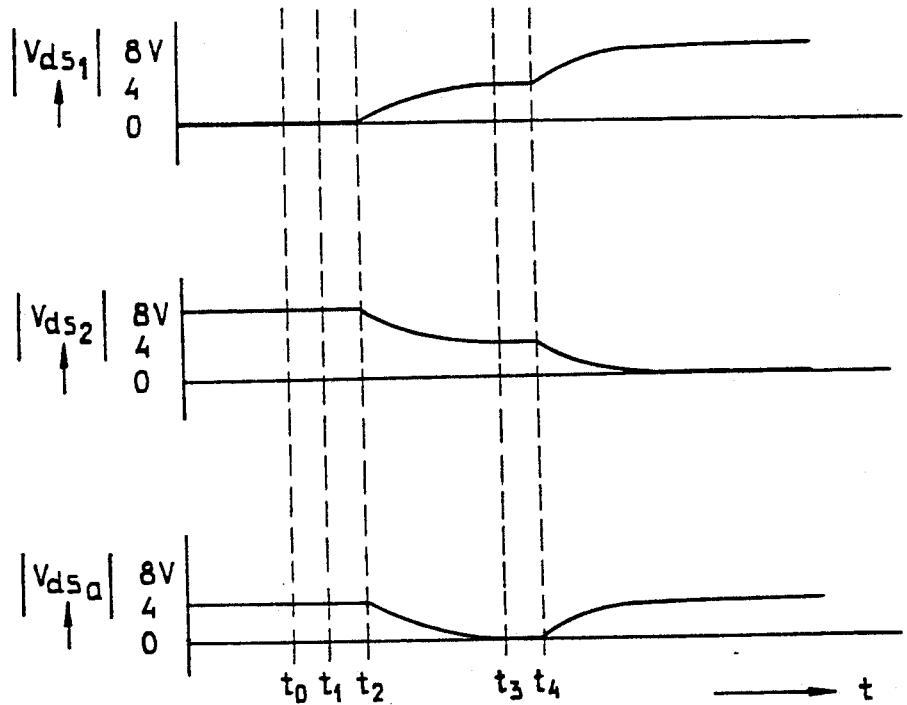
FIG. 5b is a graph representing the drain-source voltages of the gate circuits in FIG. 5a, and FIG. 6 shows a basic circuit for applying a plurality of auxiliary voltages in steps in accordance with the invention.

FIG. 5b is a graph representing the absolute value of the drain-source voltage $V_{ds}$ across the gate circuits $G_1$, $G_2$ and $G_a$ as a function of time t during the change-over from the 8 V source $S_1$ to the 0 V source $S_2$. The voltage of the auxiliary source $S_a$ is 4 V.

At the instant $t_0$, the gate circuit $G_1$ is conductive and the gate circuits $G_2$ and $G_a$ cut off. At the instant $t_1$, $G_1$ is cut off and the bus 12 is instantaneously at a voltage of 8 V. After $G_1$ is cut off $G_a$ is turned on at the instant $t_2$, as a result of which the bus 12 is brought at 4 V at a voltage of a rate which depends on its resulting capacitive load. The drain-source voltage across $G_1$ increases from 0 V to 4 V and that across $G_2$ decreasing from 8 V to 4 V, the voltage across $G_a$ decreases from 4 V to 0 V.

Subsequently, at the instant $t_3$, the additional gate circuit $G_a$ is turned off again and, at the instant $t_4$, the gate circuit $G_2$ is turned on. The drain-source voltage across $G_2$ during turn-on of this gate circuit is now 4 V, i.e. below the maximum permissible drain-source voltage in the on-state of the N-channel BIMOS transistor of $G_2$. The bus is now brought at the voltage of the new signal source $S_2$ at a rate which depends on its resulting capacitive load.

This example illustrates that when an arbitrary gate circuit is turned on, the drain-source voltage across this circuit is always smaller than 4 V. In general, the maximum source voltage to be handled for a gate circuit in BIMOS technology as shown in FIG. 1, when the circuit arrangement shown in FIG. 5a is employed, can be equal to twice the value of the maximum drain-source voltage in the on-state of the N-channel field-effect transistor, in which case the auxiliary source voltage should be equal to half the maximum source voltage. When gate circuits as shown in FIG. 3 are employed the maximum source voltage to be handled for BIMOS transistors can even be equal to approximately 11 V (twice the maximum drain-source voltage in the on-state of an N-channel MOS transistor).

Figure 6:
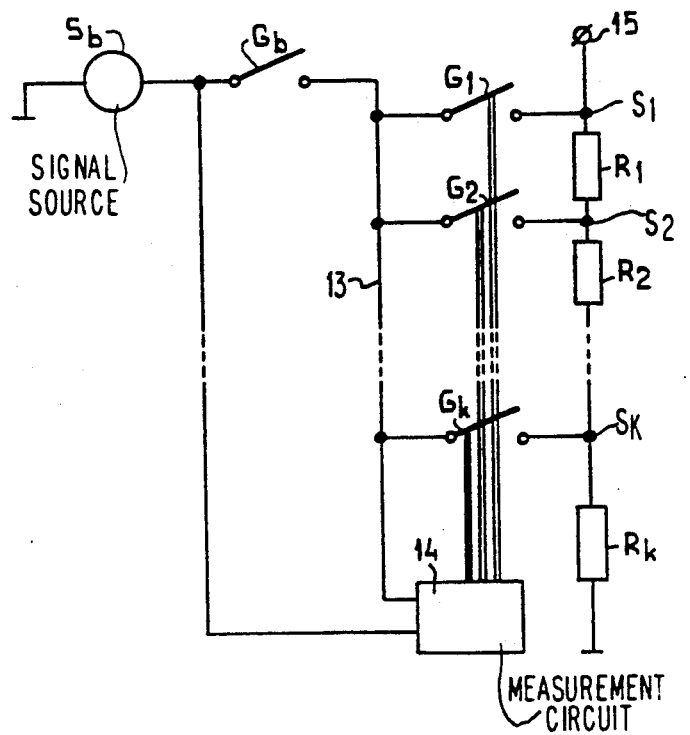

If even higher signal voltages are to be handled it is possible, for example, to employ gate circuits constructed as shown in FIG. 4 or the embodiment shown in FIG. 6 for the stepwise adaptation of the drain-source voltage across a gate circuit.

FIG. 6 again shows a bus to which a plurality of signal sources can be connected via their associated gate circuit. For simplicity only one signal source $S_b$ is shown. Moreover, a measurement circuit 14 is provided, which measures both the voltage of the line 13 as the voltage of the source to be switched on. A plurality of additional gate circuits $G_1, G_2, \ldots G_k$ are connected to the line 13, which circuits are coupled to auxiliary voltages $S_1, S_2, \ldots S_k$ (k being an integer greater than zero) via a resistive ladder network. The resistive ladder network $R_1, R_2, \ldots R_k$ is selected in such a way that when the power-supply voltage is applied to the terminal 15 the difference between two consecutive auxiliary voltages is smaller than or equal to the maximum drain-source voltage of an N-channel field-effect transistor in the on-state.

Before the gate circuit $G_b$ is turned on the instantaneous voltage difference between the line 13 and the source $S_b$ is measured by means of the measurement circuit 14. Starting with the gate circuit whose associated auxiliary voltage differs from the instantaneous voltage on the line 13 by less than the maximum permissible drain-source voltage in the on-state of an N-channel field-effect transistor, as many gate circuits are turned on as required to bring the line 13 is at a voltage equal to the voltage of the source Sb or smaller than the difference between the maximum permissible drain-source voltage in the on-state of an N-channel field-effect transistor and the voltage of the source $S_b$. The time for which the individual auxiliary voltages should be applied to the line 13 depends on the effective capacitive load of the line 13. In this way the signal swing to be handled can be extended considerably, depending on the number of auxiliary sources and additional gate circuits used. Obviously, the auxiliary voltages may be realised in any manner known per se.

Although the foregoing description utilizes field-effect transistors in BIMOS technology it is apparent that the invention is also applicable to field-effect transistors fabricated, for example, in complementary MOS technology or the like.

What is claimed is:

1. A gate circuit comprising an N-channel and a P-channel insulated-gate field-effect transistor, whose parallel-connected drain-source paths constitute a signal gate, and a control circuit connected to their respective gate electrodes to switch the state of the field-effect transistors, characterized in that means are provided for protecting said N-channel transistor from drain-source voltage overload, said protecting means comprising means for turning on the N-channel field-effect transistor at least a drain-source voltage lower than a selected value, in that said protecting means comprises delay means coupled to the control circuit for turning on the N-channel field-effect transistor with a delay relative to turning on the P-channel field-effect transistor, and in that the control circuit comprises an inverter circuit and a first and a second series arrangements of an N-channel and a P-channel field-effect transistor, which series arrangements are each coupled across a first and a second power-supply terminal, two field-effect transistors of a selected one conductivity type in said series arrangements being cross-coupled to each other to form a bistable trigger circuit, the gate electrode of a field-effect transistor of a selected other conductivity type in the first series arrangement being coupled by said inverter circuit; and the gate electrode of a corresponding field-effect transistor of the second series arrangement being coupled directly to a control input terminal for controlling the N-channel and P-channel field-effect transistors of the signal gate, whose gate electrodes are coupled to the first and the second series arrangements, respectively, and the control circuit further comprising at least one pair of further field-effect transistors which are arranged in cascode with the field-effect transistors of, respectively, the first and the second series arrangement and whose gate electrodes comprise terminals for applying an at least one auxiliary voltage.

2. A gate circuit as claimed in claim 1, characterized in that a width/length ratio of the drain-source channel of the field-effect transistors of the first and the second series arrangement is smaller for the selected one conductivity type than for the selected other conductivity type.

3. A gate circuit as claimed in claim 2, characterized in that the width/length ratio of the drain-source channel of the field effect transistor of the one conductivity type of the first series arrangement is smaller than that of the corresponding field-effect transistor of the second series arrangement.

4. A gate circuit as claimed in claim 1, characterized in that said protecting means comprises switching means arranged in series with the signal gate for connecting the signal gate to an at least one auxiliary voltage.

5. A gate circuit as claimed in claim 4, characterized in that the switching means comprises at least one pair of parallel-connected N-channel and P-channel insulated-gate field-effect transistors.

* * * * *